(12) United States Patent (10) Patent No.: US 7,409,066 B2
Montag et al. (45) Date of Patent: *Aug. 5, 2008

(54) METHOD OF ADJUSTING FILTER PARAMETERS AND AN ASSOCIATED PLAYBACK SYSTEM

(75) Inventors: Christoph Montag, Hildesheim (DE); Joerg Sahrhage, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 1126 days.

This patent is subject to a terminal disclaimer.

(21) Appl. No.: 10/456,425

(22) Filed: Jun. 6, 2003

(65) Prior Publication Data

US 2004/0033056 A1    Feb. 19, 2004

(30) Foreign Application Priority Data

Jun. 6, 2002   (DE) ................. 102 25 146

(51) Int. Cl.
*H03G 5/00* (2006.01)
*H03G 3/00* (2006.01)
*H03G 7/00* (2006.01)
*H04R 29/00* (2006.01)
*H04B 1/00* (2006.01)

(52) U.S. Cl. ................. 381/98; 381/99; 381/100; 381/103; 381/102; 381/104; 381/56; 381/86; 381/58

(58) Field of Classification Search ......... 381/98–100, 381/103, 102, 104, 106, 56–59, 86
See application file for complete search history.

(56) References Cited

U.S. PATENT DOCUMENTS

| 4,596,902 A | * | 6/1986 | Gilman ................. 381/320 |
| 5,995,817 A | | 11/1999 | Lubbe et al. |
| 6,885,752 B1 | * | 4/2005 | Chabries et al. .......... 381/321 |
| 7,016,509 B1 | * | 3/2006 | Bharitkar et al. .......... 381/98 |

FOREIGN PATENT DOCUMENTS

| DE | 100 27 618 | 1/2001 |
| EP | 0 451 620 | 10/1991 |
| FR | 2 478 409 | 9/1982 |

* cited by examiner

*Primary Examiner*—Vivian Chin
*Assistant Examiner*—Devona E. Faulk
(74) *Attorney, Agent, or Firm*—Kenyon & Kenyon LLP

(57) ABSTRACT

To improve upon a method of adjusting at least one filter parameter such as the mid-frequency of at least one filter unit provided with a playback system for audio signals, this filter unit being provided in particular for at least one digital equalizer assigned to the playback system, as well as an associated playback system so as to achieve automatic optimization of an acoustically correct bass level boosting,

[a] first the acoustic frequency response is determined,
[b] then a cutoff frequency below which the sound pressure falls below a sound pressure threshold level based on the average sound pressure is determined, and
[c] next the filter parameter(s) of the filter unit is/are adjusted automatically, so that the mid-frequency of the filter unit is just above the cutoff frequency thus determined.

10 Claims, 4 Drawing Sheets

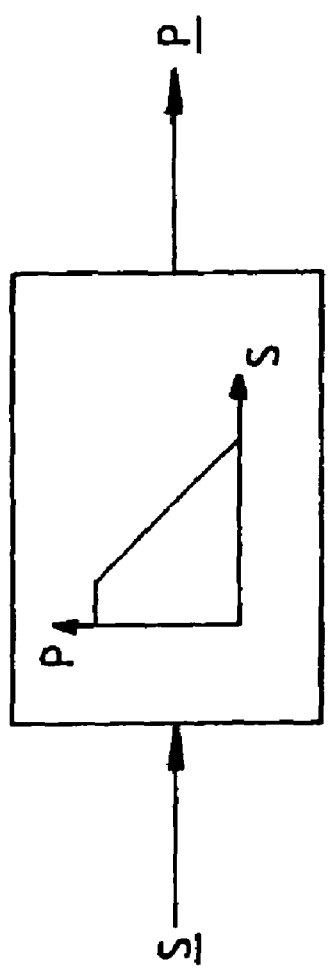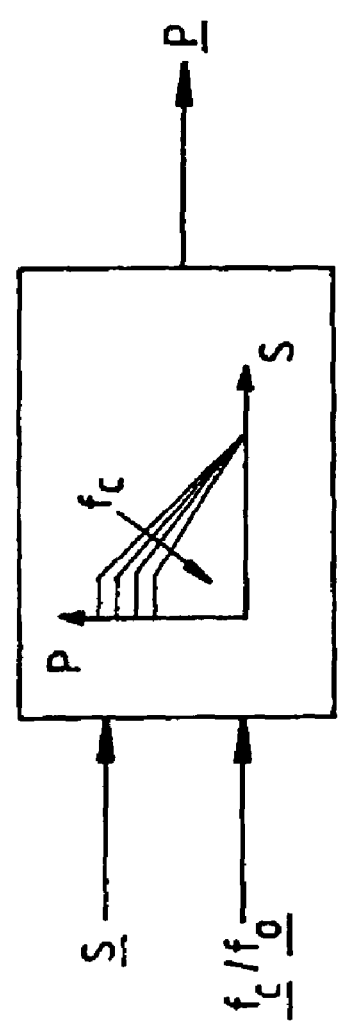

METHOD OF ADJUSTING FILTER PARAMETERS AND AN ASSOCIATED PLAYBACK SYSTEM

FIELD OF THE INVENTION

The present invention relates to a method of adjusting at least one filter parameter such as the mid-frequency, of at least one filter unit provided for a playback system for audio signals, in particular a second-order recursive filter unit or a resonance filter unit, which is associated in particular with at least one digital equalizer provided with the playback system.

The present invention also relates to a playback system for audio signals, in particular for performing a method of the type described above, which is provided for adjusting at least one filter parameter, such as the mid-frequency of at least one filter unit associated with the playback system, in particular to at least one digital equalizer provided for the playback system, having at least one loudspeaker device and having at least one audio processor which contains the equalizer and situated in the signal path between at least one signal source and the loudspeaker device and connected to at least one control processor by at least one control bus.

BACKGROUND INFORMATION

The present invention is directed to car radio equipment which is known in practice and is based on "21C technology" in which the audio playback device and its tuner in particular are equipped with a digital receiver unit in particular (known as a "digiceiver"). In other words, this means that, for example, the high-frequency signal of the IF (intermediate frequency) stage at 10.7 megahertz is converted into bits and bytes as early as in the reception part of the tuner, and following this, it is processed further consistently on a digital level up to the output stages.

In such car radio equipment, for example, two or three freely programmable audio filters are integrated into the signal path. These digital parametric equalizers (DPEs) are available to the user to compensate for inadequacies in the acoustics in the interior of the vehicle. The user is able to adjust certain parameters of each filter, e.g., with respect to damping or quality, i.e., filter width, mid-frequency and/or gain to compensate for overshooting and holes, as they are called, in the acoustic frequency response of the interior of the vehicle.

In conjunction with the acoustic frequency response or, in more general terms, the loudness perception of the human ear, it should be recalled that this loudness perception varies over the audible frequency range. This means, in other words, that the sensitivity of the human ear is not constant over all frequencies but instead decreases toward high frequencies and declines to an even greater extent toward low frequencies. This effect is even more pronounced at lower sound pressure levels and, as shown in FIG. 1, it is described in the literature by curves of equal loudness (known as isophones) plotted as sound pressure level L (in dB=decibel) as a function of frequency f (in Hz=hertz) (see also ISO (International Standardization Organization) 226).

At an audio frequency of one hundred hertz, for example, a much higher sound pressure level is necessary to achieve the same loudness impression as at a frequency of one kilohertz. This relationship is illustrated by the plot of the aforementioned lines of equal loudness in a sound pressure/frequency diagram (see FIG. 1, where the speech range has been labeled as 80, the music range as 82 and the audible threshold as 84).

To compensate for this effect, audio signal playback systems often have a device for selective boosting of the bass level at a low playback loudness. In many systems, the highs are also boosted slightly. This device, which is known as "acoustically correct loudness correction" or "loudness control" is intended to keep the loudness of the audio signal perceived by the listener constant over the entire audible frequency spectrum, regardless of playback loudness, i.e., to ensure a spectrally balanced sound.

Therefore, many systems have implemented a loudness function to ensure that the sound impression, e.g., as the balance between low frequency components and medium frequency components, remains uniform at all loudness levels in an audio playback system.

This loudness function also alters the tone adjustment in conjunction with loudness, so that all frequency components are perceived as equally loud. In particular, in a simple embodiment the low frequency components below a certain use frequency are boosted with the help of a sound control unit at a reduced loudness; this then constitutes the main component of an acoustically correct correction of frequency response. This use frequency is either set at the factory in each audio playback system or it may be manually adjusted by the user within certain limits.

However, in the case of known loudness functions, the choice of an optimum use frequency for boosting the bass level poses a problem. Since the sensitivity of the human ear declines greatly at low frequencies, it is usually necessary to boost the bass level to extremely low frequencies in order to achieve an acoustically correct correction.

However, this is not appropriate in all audio playback systems, because the performance of certain amplifiers and/or loudspeakers potentially does not allow playback of extremely low frequencies. Greater boosting at very low frequencies would thus have no acoustic effect and might under some circumstances even result in overloading the amplifier stages and/or loudspeakers.

For such systems, it is advisable to choose a higher use frequency and/or to limit boosting toward low frequencies in order to achieve at least an acoustically correct correction for the upper bass frequency range without overloading the playback system. If the performance of the amplifier stages and/or loudspeakers is not known by the control unit responsible for the loudness, which is typically the case in a system having a "car radio booster loudspeaker," the adjustment of the loudness characteristic at the factory may not always be optimal.

Manual adjustment of the loudness characteristic by the user, however, requires a certain amount of acoustic and technical knowhow. In particular, such a manual adjustment proves problematical in practice inasmuch as the user must be very familiar with the acoustics of his vehicular device to make an optimum adjustment of the equalizer, and it is very difficult to determine the acoustic frequency response without the help of measurement technology, i.e., merely by listening.

The operating instructions of known car radio equipment may provide only very limited assistance in making the best possible adjustment of the equalizers, because these operating instructions are by no means able to take into account all makes and models of vehicles, let alone the multitude of individual equipment options and amplifier and loudspeaker configurations.

Furthermore, car radio equipment having an audio module which is integrated into the signal path and has a graphic equalizer implemented on it with the help of a digital signal processor, are also known. The seven or nine bands of such a graphic equalizer have a fixed mid-frequency and only the gain is adjustable. The separate audio module with such car radio equipment permits automatic calibration of the graphic equalizer.

To do so, the acoustics in the interior of the vehicle is measured with the help of a microphone connected to the audio module via an AD (analog/digital) converter. With the help of special software, the graphic equalizer is then adjusted to compensate as much as possible for the acoustic inadequacies.

Use of a graphic equalizer to optimize the acoustically correct boosting of the bass level has proven to be problematical in practice with respect to the acoustics of the interior of a vehicle. As mentioned above, the mid-frequencies of the equalizer bands of a graphic equalizer are fixed, usually being a minimum interval of one octave in the case of nine bands. Thus, narrow resonance overshooting in the acoustic frequency response of the interior of the vehicle between the equalizer bands will not be optimally compensated. Furthermore, the additional audio module having the digital signal processor for implementing the graphic equalizer and for calibration of this equalizer are relatively cost intensive.

SUMMARY OF THE INVENTION

On the basis of the disadvantages and inadequacies described above and taking into account the related art as outlined, the object of the present invention is to improve upon a method and a playback system so as to achieve automatic optimization of an acoustically correct boosting of the bass.

According to the present invention, an automatic optimization of the loudness of the audio playback system is achieved. In the method according to the present invention, this is associated with automatic optimization of the acoustically correct boosting of the bass in the playback system and is implemented by a calibration method which determines the efficiency of the audio playback system as a function of audio frequency and thus optimizes the loudness characteristic in the playback system so the best possible frequency response correction may be performed as a function of the performance of the playback system.

According to the present invention, this is achieved by a method of automatic optimization of the acoustically correct boosting of the bass in the audio playback system, in which the acoustic frequency response of the interior of the vehicle is determined first, then a cutoff frequency, below which the sound pressure level falls below a sound pressure threshold value based on the average sound pressure, is determined, and following that, the filter parameter(s) of the filter unit is/are automatically adjusted so that the mid-frequency of the filter unit is just above the cutoff frequency thus determined.

The present invention thus relieves the user of the difficult task of adjusting the filter unit(s) to the specific acoustics of the interior of his/her vehicle. In this connection, measuring the amplitude response and/or frequency response not only makes it possible to adjust n−1 equalizer filters but also makes it possible to adjust a loudness filter in the lower frequency range—as a surprising byproduct which could not be foreseen by those skilled in the art—assuming a total of n second-order recursive filters in the playback system as an example. In this connection, the loudness filter is one of the resonance filters, or in more general terms, one of the n second-order recursive filters (under certain conditions, the recursive filter may also be designed as a shelving filter, but this is not the norm in the case of the present invention).

Specifically, first the frequency response of the given audio playback system is determined by a suitable device. Following this, the measured frequency response is analyzed with respect to the efficiency of the playback system in the low-frequency range.

First, the average sound pressure level may be determined from the measured frequency response. Following that, the frequency point in the low frequency range beneath which the sound pressure level falls below a certain limit value based on the average sound pressure, e.g., approximately 3 decibels, is determined. A loudness filter or resonance filter is then adjusted exactly, so that the mid-frequency is just above this cutoff frequency of the audio system.

This ensures that bass boosting will in fact be acoustically effective without overloading the system because the frequency response of the loudness filter or resonance filter drops again below the mid-frequency. As a result, this method is based on one of the digital equalizers being assigned to the loudness functionality, i.e., checking for a drop by approx. 3 dB, for example.

In addition, a playback system is proposed, including a noise generator, which supplies a noise signal to the equalizer assigned to the filter unit, for automatic adjustment of the at least one filter unit according to the present invention.

In addition, the control processor has an element by which the filter parameters are adjustable so that the equalizer has a bandpass characteristic having a narrow bandwidth, the mid-frequency being variable over the audio spectrum.

At least one microphone having an analyzer device is provided for detecting the signal emitted by the loudspeaker device into the interior of the vehicle and determining the frequency response.

Finally, the control processor also has a device by which the filter parameters are adjustable, taking into account the measured frequency response.

According to the present invention, it has been recognized that because of their programmability, the equalizers to be calibrated may be used first to determine the acoustic frequency response of the interior of the vehicle, before determining a cutoff frequency below which the sound pressure falls below a sound pressure threshold value based on the average sound pressure, and then the filter parameter(s) of the filter unit is/are adjusted automatically, so that the mid-frequency of the filter unit is just above the cutoff frequency thus determined.

The feature whereby the filter parameter(s) of the filter unit is/are adjusted automatically so that the mid-frequency of the filter unit is just above the cutoff frequency determined may be associated with the feature whereby the boosting of the bass level is reduced with an increase in cutoff frequency and/or mid-frequency of the filter unit, so that the isophones in the remaining reproducible bass frequency range are not exceeded (→functional relationship between the filter mid-frequency/cutoff frequency and the loudness setting as input variables and the resulting bass boosting as an output variable. This functional relationship is based on a mathematical function and may be accomplished continuously or in stages, depending on the particular givens. Thus, as a result, automatic optimization of an acoustically correct bass level boosting is achieved by adjusting the filter parameters of the bass-boosting filter unit as a function of the cutoff frequency and/or the mid-frequency).

In this way, acoustically correct bass level boosting is automatically optimized in a synergistic manner while at the same time excessive boosting of the bass level is prevented. It has also been found according to the present invention that acoustically correct bass level boosting may be optimized using the control processor of the car radio device, which is present anyway, with the help of appropriate additional software.

Thus, as a result, no additional audio module having a digital signal processor is necessary with the present invention, but instead this requires only a microphone circuit, an amplifier circuit and a rectifier circuit, which are connected to the AD (analog/digital) converter unit present in the control processor. Therefore, only a very small increased complexity in terms of hardware and software and therefore a small increased cost are necessary for automatic adjustment of the filter parameters with respect to the mid-frequency as proposed according to the present invention.

There are essentially various possibilities for determining the acoustic frequency response of the interior of the vehicle as part of the present method. According to an advantageous embodiment, the loudspeaker device of the playback system is triggered by a series of bandpass noise signals having different mid-frequencies one after the other. The frequency bands, which are each adjusted in the form of a bandpass noise signal, cover the entire audio spectrum.

The frequency response to be determined is now determined in the form of frequency measurement points for the individual frequency bands. The sound level of the signal, which is emitted by the loudspeaker device into the interior of the vehicle in this case, may be determined simply as a frequency measurement point for a certain frequency band.

From the standpoint of minimizing hardware and software complexity, it has proven advantageous for the bandpass noise signals for determining the acoustic frequency response of the interior of the vehicle to be generated with the help of the equalizer itself which is to be adjusted.

Since both the mid-frequency and the quality of the equalizer are freely programmable, the filter parameters may be adjusted so as to yield a bandpass characteristic having a narrow bandwidth at a predefined mid-frequency for the equalizer. Then the equalizer generates the desired bandpass noise signal and a series of bandpass noise signals covering the entire audio spectrum from a noise signal supplied to it.

If the filter parameters of a plurality of digital equalizers are adjusted automatically, it is advantageous for the filter parameters of the individual equalizers to be determined in succession by using the previously adjusted equalizer(s) at the measured frequency response before determining the filter parameters of an equalizer.

Finally, the present invention relates to the use of the method and/or the playback system of the type described above for audio signals in at least one mode of transportation, in particular in the interior of at least one motor vehicle.

BRIEF DESCRIPTION OF THE DRAWINGS

FIGS. 4A and 4B show the operating principle of a playback system 100 according to the present invention, as illustrated in FIG. 2.

DETAILED DESCRIPTION

Figure 3:
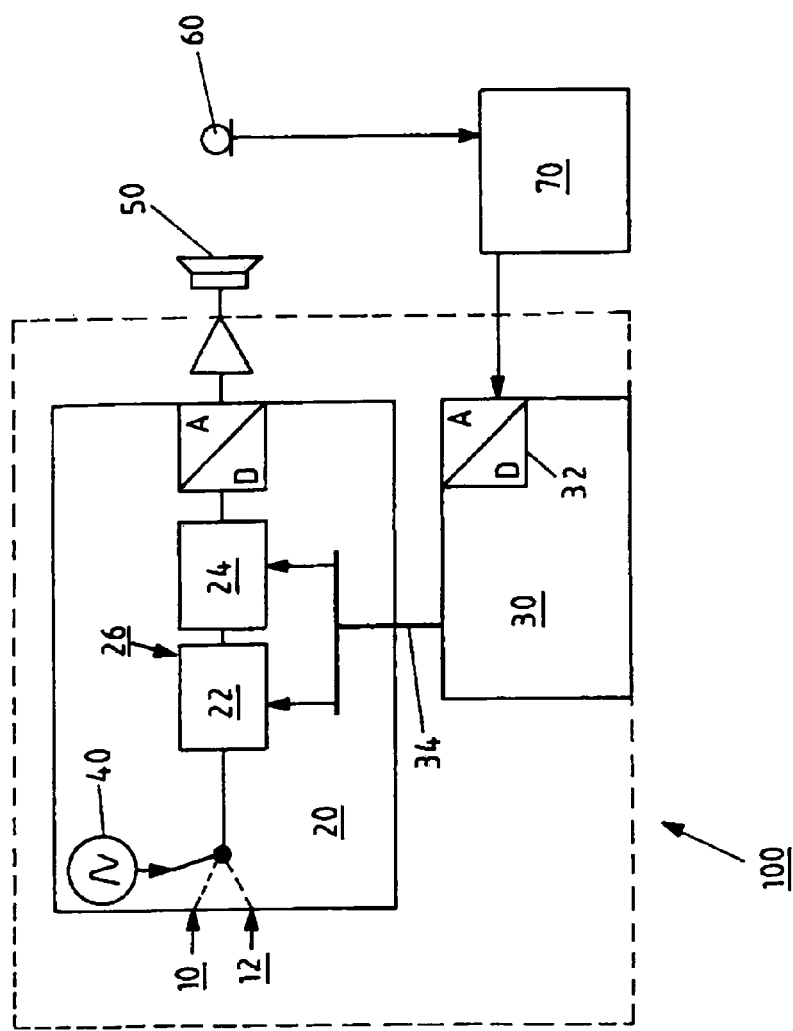
FIG. 3 shows a schematic block diagram (=flow chart) of an exemplary embodiment of a method according to the present invention.

Audio playback system 100 illustrated in FIG. 3 is used for playback of audio signals in the interior of a motor vehicle, the audio signals being generated by various audio sources 10, 12 such as a CD (compact disc), a radio or the like.

Playback system 100 has a loudspeaker device 50 and an audio processor 20 situated in the signal path between audio sources 10, 12 and loudspeaker device 50, this processor having two freely adjustable digital equalizers 22, 24 by which the signals of different audio sources 10, 12 may be sent to loudspeaker device 50. More than two equalizers 22, 24 may of course also be provided here. For adjusting the filter parameters, in particular for adjusting the mid-frequency, a control processor 30 sends suitable filter parameters to audio processor 20 via a control bus 34.

For determining and/or measuring the frequency response of the present audio system in the interior of a vehicle (=method step [a] according to FIG. 2), playback system 100 also has a noise generator 40, which is able to send a noise signal to equalizers 22, 24. Noise generator 40 is implemented here as extra software in audio processor 20 which may be initialized as needed via control processor 30.

As an alternative, the noise signal may also be generated by an external noise source as an additional audio source, e.g., with the help of a corresponding CD (compact disc) or with the help of a suitably tuned tuner.

In addition, control processor 30 has a device by which the filter parameters may be adjusted, so that equalizers 22, 24 have a narrow bandwidth bandpass characteristic, i.e., a quality on the order of 8, the mid-frequency being variable over the audio spectrum. In this way, loudspeaker device 50 may be triggered using a bandpass noise signal with the help of noise generator 40 via equalizers 22, 24.

If calibration of equalizers 22, 24 has been initiated, e.g., by pressing a pushbutton, control processor 30 varies the filter parameters in a defined chronological order, so the mid-frequency of the bandpass filter decreases, e.g., in the third-octave interval from the highest to the lowest frequency to be set.

The signals, which are then emitted into the interior of the vehicle via loudspeaker device 50, are detected with the help of a microphone 60 and analyzed by a suitable analyzer device 70 for determining the frequency response in the interior of the vehicle.

To do so, the signals picked up by microphone 60 are amplified, logarithmized and rectified in an operational amplifier circuit, so that a direct voltage appears at the output of this circuit. This direct voltage is proportional to the sound level, i.e., the sound pressure in the interior of the vehicle for the frequency band set by the particular bandpass noise signal. The sound level for the entire audio spectrum is detected by tuning equalizers 22, 24.

The direct voltage representing the sound level is sampled by an AD (analog/digital) converter 32 of control processor 30, so that control processor 30 has an accurate picture of the acoustic frequency response of the interior of the vehicle after all the frequencies and/or frequency bands to be measured have been tuned using the corresponding voltage values. The frequency response is understood here to refer only to the absolute value of the frequency response and/or the amplitude response but not the phase response.

Then in a second method step [b] (see FIG. 2), a lower cutoff frequency below which the sound pressure falls below a sound pressure threshold value based on the average sound pressure is determined in control processor 30. In a subsequent method step [c] (see FIG. 2), the mid-frequency of loudness filter 26 (=resonance filter) is then automatically set, resulting in automatic optimization of an acoustically correct bass level boosting.

Figure 1:
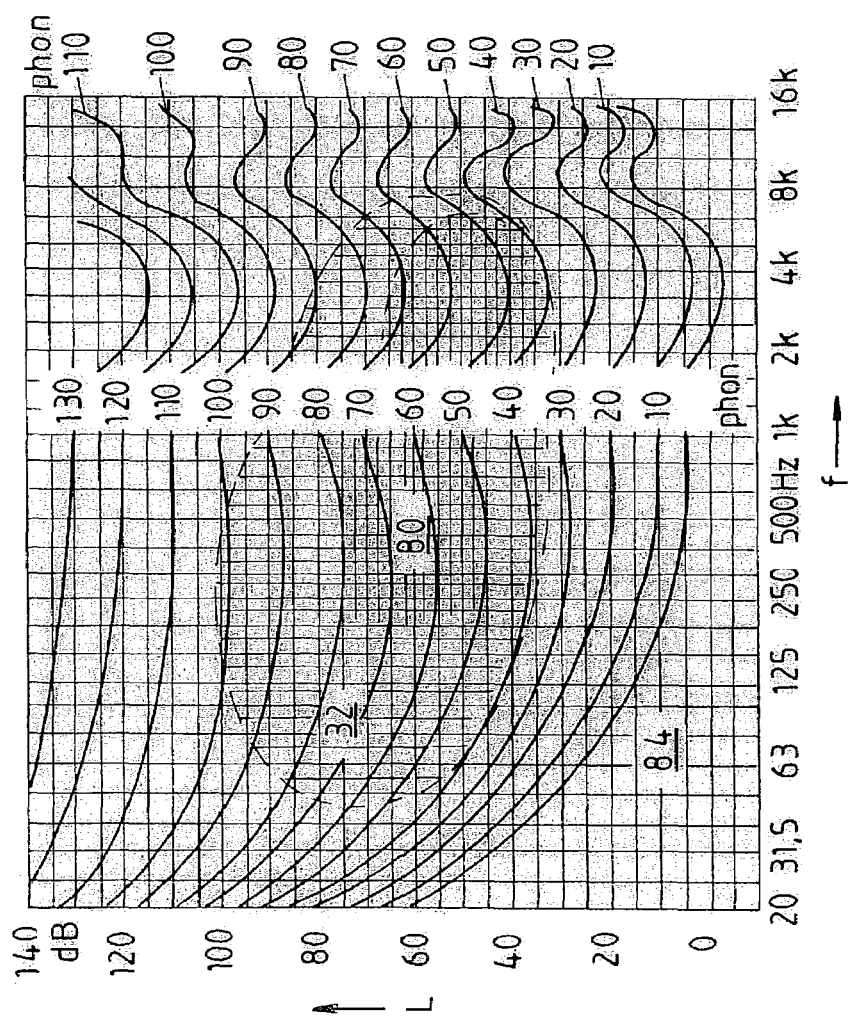
FIG. 1 shows a diagram normalized according to the ISO (International Standardization Organization) for curves of equal loudness (known as isophones), plotted as sound pressure level over frequency.
Figure 2:
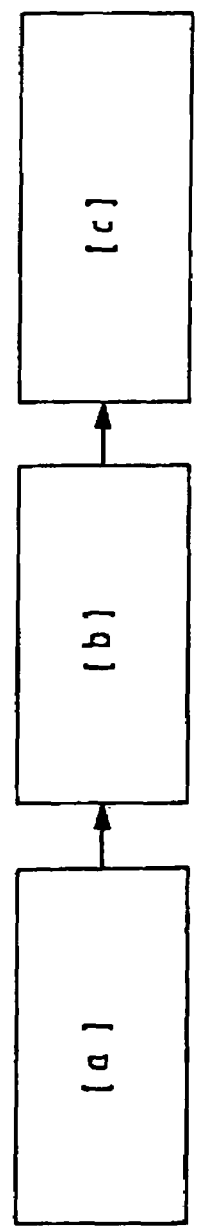
FIG. 2 shows a schematic diagram (=block diagram) of an exemplary embodiment of a playback system according to the present invention, provided for implementing the method according to FIG. 3.

Thus, with the present invention according to FIGS. 2 and 3, the user is relieved of the difficult task of adjusting filter unit 26 to the specific acoustics of his/her vehicle interior. In this connection, measurement of amplitude response and/or frequency response makes it possible to not only adjust the two equalizer filters 22, 24 but also to adjust loudness filter 26 in the lower frequency range (in this connection, loudness filter 26 is one of the resonance filters, or in more general terms, one of the second-order recursive filters). As a result, the method according to FIG. 2 is thus based on the fact that one of digital equalizers 22, 24 in FIG. 3 is assigned to the loudness functionality, i.e., checking for a drop by approximately 3 dB, for example.

The feature whereby the filter parameter(s) of loudness filter 26 is/are automatically adjusted so that the mid-frequency of loudness filter 26 is just above the cutoff frequency determined may be linked to the feature whereby the bass level boosting is reduced with an increase in cutoff frequency and/or mid-frequency of loudness filter 26 in such a way that the isophones in the remaining reproducible bass frequency range are not exceeded. Therefore, in a synergistic manner, the acoustically correct bass level boosting is automatically optimized, while at the same time excessive boosting of the bass level is avoided.

The total additional complexity in comparison with a car radio device in which the equalizers are not automatically adjustable includes additional hardware 40 and/or additional software for generating a noise signal, additional software in control processor 30, which determines the sequence control of the calibration procedure (=method step [a]; see FIG. 2) and determination of the best filter parameter setting(s) and it includes additional hardware 70 for amplification, logarithmization and rectification of the signals of microphone 60.

To determine the best possible settings of the filter parameters, normalized model equalizer curves of differing qualities may also be stored in audio processor 20.

In conclusion, it should also be pointed out that the automatic loudness optimization described above is also readily verifiable on audio playback system 100 because first, a frequency response measurement is activatable by the user (→operating instructions) and second, the optimization may be verified by measuring the loudness curves after performing frequency response measurements in different audio systems.

What is claimed is:

1. A method of adjusting at least one filter parameter of at least one filter unit associated with a playback system for an audio signal, comprising:
   (a) determining an acoustic frequency response;
   (b) determining a cutoff frequency below which a sound pressure falls below a sound pressure threshold level based on an average sound pressure; and
   (c) automatically adjusting the at least one filter parameter so that a mid-frequency of the filter unit is just above the cutoff frequency.

2. The method as recited in claim 1, wherein:
   the at least one filter unit includes one of a second-order recursive filter unit and a resonance filter unit assigned to at least one digital equalizer associated with the playback system.

3. The method as recited in claim 1, wherein the determining of the acoustic frequency response includes:
   triggering at least one loudspeaker device of the playback system by a series of bandpass noise signals including frequency bands having different mid-frequencies, the frequency bands, adjusted in the form of at least one bandpass noise signal, covering the entire audio spectrum, and
   determining the acoustic frequency response in the form of frequency measurement points for the frequency bands, a sound level of the audio signal, emitted by the loudspeaker device, being determined as the frequency measurement point for one of the frequency bands.

4. The method as recited in claim 3, further comprising:
   causing an equalizer to generate the bandpass noise signals by:
   supplying at least one of the bandpass noise signals to the equalizer, and
   adjusting the at least one filter parameter so that a bandpass characteristic having a narrow bandwidth at a predefined mid-frequency is obtained for the equalizer.

5. The method as recited in claim 1, further comprising:
   determining a level of the average sound pressure between step (a) and step (b).

6. The method as recited in claim 1, wherein:
   the at least one filter parameter is adjusted such that a bass level boosting is reduced with an increase in at least one of the cutoff frequency and the mid-frequency such that isophones in a remaining reproducible bass frequency range are not exceeded.

7. The method as recited in claim 1, wherein:
   the at least one filter parameter is automatically adjusted using at least two digital equalizers, and
   a first filter parameter of a first one of the at least two digital equalizers and a second filter parameter of a second one of the at least two digital equalizers are determined one after the other by using the previously adjusted at least two equalizers at the frequency response determined before determining the first filter parameter and the second filter parameter of the at least two digital equalizers.

8. A playback system for an audio signal and for adjusting at least one filter parameter of at least one filter unit associated with the playback system, the playback system comprising:
   at least one loudspeaker device;
   at least one audio processor including at least one digital equalizer and situated in a signal path between at least one signal source and the at least one loudspeaker device;
   at least one control bus;
   at least one control processor connected to the at least one digital equalizer via the at least one control bus;
   at least one noise generator for transmitting at least one noise signal to the at least one digital equalizer; and
   at least one microphone including an analyzer device for detecting a signal emitted by the at least one loudspeaker device and for determining a frequency response, wherein:
   the control processor includes an arrangement for determining a cutoff frequency below which a sound pressure falls below a sound pressure threshold level based on an average sound pressure, and an arrangement for adjusting the at least one filter parameter in order to provide the at least one digital equalizer with a narrow-bandwidth bandpass characteristic, a mid-frequency of the at least one filter unit being variable over an audio spectrum, and the arrangement for adjusting the at least one filter parameter takes into account the frequency response.

9. The playback system as recited in claim 8, wherein the at least one noise generator one of:

is implemented in the at least one audio processor, and is realized as an additional external signal source.

10. The playback system as recited in claim 8, wherein:

the analyzer device includes an arrangement for amplifying, logarithmizing, and rectifying the signal emitted by the at least one loudspeaker device.

\* \* \* \* \*